(12) United States Patent
Priel et al.

(10) Patent No.: US 8,598,949 B2
(45) Date of Patent: Dec. 3, 2013

(54) ELECTRONIC CIRCUIT AND METHOD FOR STATE RETENTION POWER GATING

(75) Inventors: Michael Priel, Hertzelia (IL); Leonid Fleshel, Hertzelia (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/634,730

(22) PCT Filed: Jun. 11, 2010

(86) PCT No.: PCT/IB2010/052613
§ 371 (c)(1),
(2), (4) Date: Sep. 13, 2012

(87) PCT Pub. No.: WO2011/154778
PCT Pub. Date: Dec. 15, 2011

(65) Prior Publication Data
US 2013/0076421 A1  Mar. 28, 2013

(51) Int. Cl.
*G05F 1/10* (2006.01)
(52) U.S. Cl.
USPC .......................................... 327/544; 327/199
(58) Field of Classification Search
USPC ............... 327/199–222, 530, 534, 535, 538, 327/540–544
See application file for complete search history.

(56) References Cited

U.S. PATENT DOCUMENTS

| | | | |
|---|---|---|---|
| 6,836,179 B2 | 12/2004 | Mizuno et al. | |
| 7,183,825 B2 | 2/2007 | Padhye et al. | |
| 7,266,797 B2 | 9/2007 | Bakir et al. | |
| 7,420,388 B2 | 9/2008 | Bhattacharya | |
| 7,428,649 B2 | 9/2008 | Clark | |
| 7,643,368 B2 | 1/2010 | Choi et al. | |
| 7,908,499 B2 * | 3/2011 | Ito | 713/320 |
| 8,289,060 B2 * | 10/2012 | Tower et al. | 327/218 |
| 2009/0315399 A1 | 12/2009 | Shikata | |
| 2010/0097097 A1 | 4/2010 | Kim et al. | |

OTHER PUBLICATIONS

International Search Report and Written Opinion correlating to PCT/IB2010/052613 dated Mar. 24, 2011.

* cited by examiner

*Primary Examiner* — Lincoln Donovan
*Assistant Examiner* — Sibin Chen

(57) ABSTRACT

A method and a electronic circuit, the method includes: sending to a switching circuit, to a state retention power gating (SRPG) circuit and to a first power source a control signal indicating that the SRPG circuit should operate in a functional mode; coupling, by the switching circuit, a third power grid to a first power grid; supplying power from the first power source to the SRPG circuit via the first power grid, the switching circuit and the third power grid; supplying power from a second power source to a second circuit via a second power grid; sending to the switching circuit, to the SRPG circuit and to the first power source a control signal indicating that the SRPG circuit should operate in a state retention mode; coupling, by the switching circuit, the third power grid to the second power grid; supplying power from the second power source to the SRPG circuit via the second power grid, the switching circuit and the third power grid; supplying power from the second power source to the second circuit via the second power grid; and storing, by the SRPG state information.

20 Claims, 4 Drawing Sheets

ELECTRONIC CIRCUIT AND METHOD FOR STATE RETENTION POWER GATING

FIELD OF THE INVENTION

This invention relates to a method and a electronic circuit for state retention power gating.

BACKGROUND OF THE INVENTION

State retention power gating (SRPG) is an effective strategy that is widely used to help reducing power consumption of an integrated circuit while maintaining the same levels of performance and functionality.

A SRPG flip-flop may operate in a functional mode or in a state retention mode. In the functional mode, the SRPG flip-flop performs its primary function, such as processing or storing bits. When in the state retention mode the SRPG flip-flop stores state information that is indicative of a state of the SRPG flip-flop at the end of the functional mode preceding the entry into the state retention mode. The power consumption of the SRPG flip-flop, when in the state retention mode, is lower than the power consumption of the SRPG flip-flop when in the functional mode.

The SRPG flip-flop is connected to a gated power grid and to a non-gated power grid. The non-gated power grid provides power to the SRPG flip-flop when the SRPG flip-flop is in the state retention mode and also provides power to the SRPG flip-flop when in the functional mode. The gated power grid provides power to the SRPG flip-flop only when the SRPG flip-flop in the functional mode.

The gated power grid and the non-gated power grid may be connected to a power source that provides power regardless of the operational mode of the SRPG flip-flop. Typically, the gated power grid may be connected to the power source via multiple switches. However, the placement of these switches may be very problematic in dense integrated circuit and especially in flip-chip package integrated circuits in which power source pins are positioned above the semiconductor real estate.

SUMMARY OF THE INVENTION

The present invention provides a method and a electronic circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG.s are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
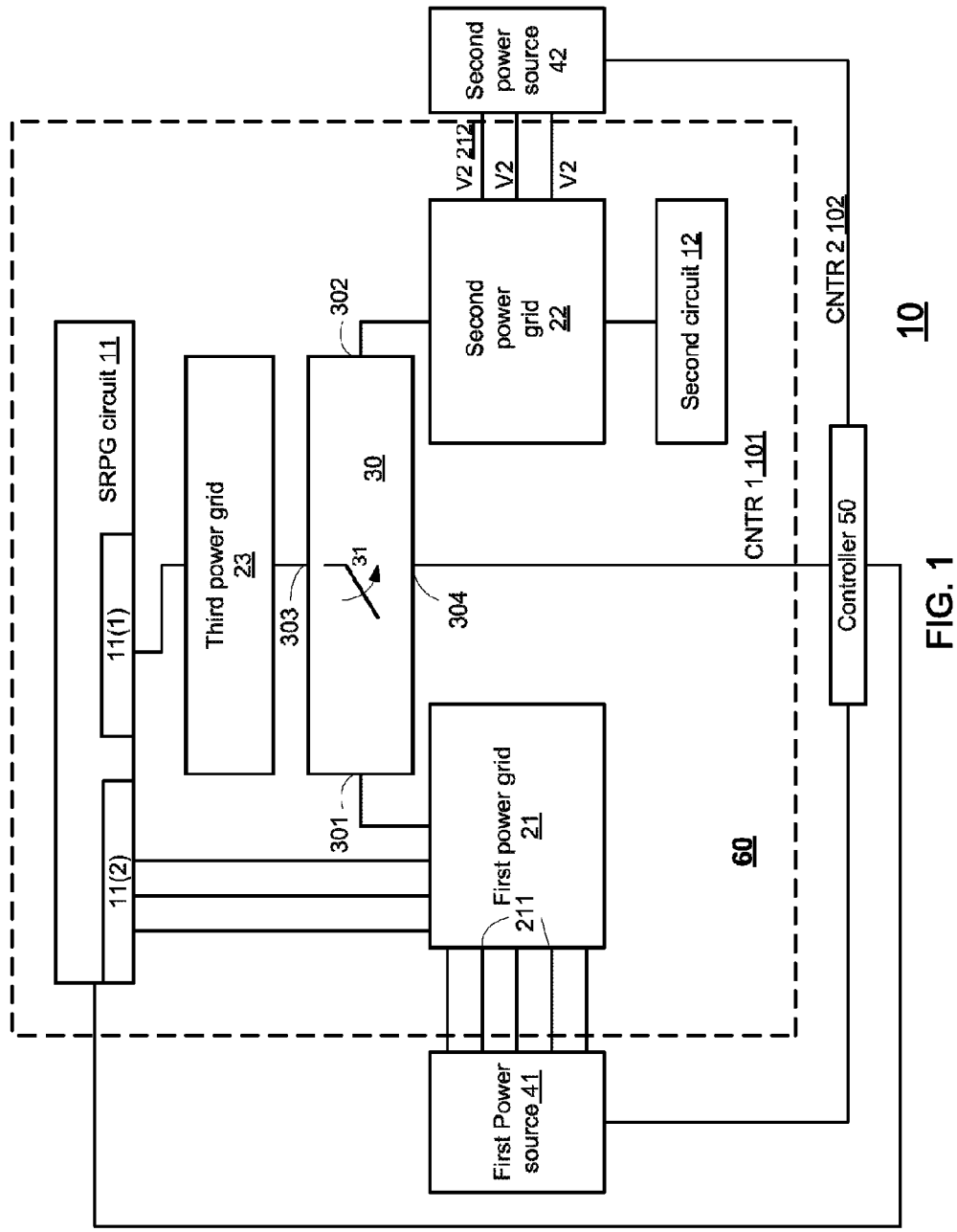
FIG. 1 schematically shows an example of an embodiment of a electronic circuit.
Figure 2:
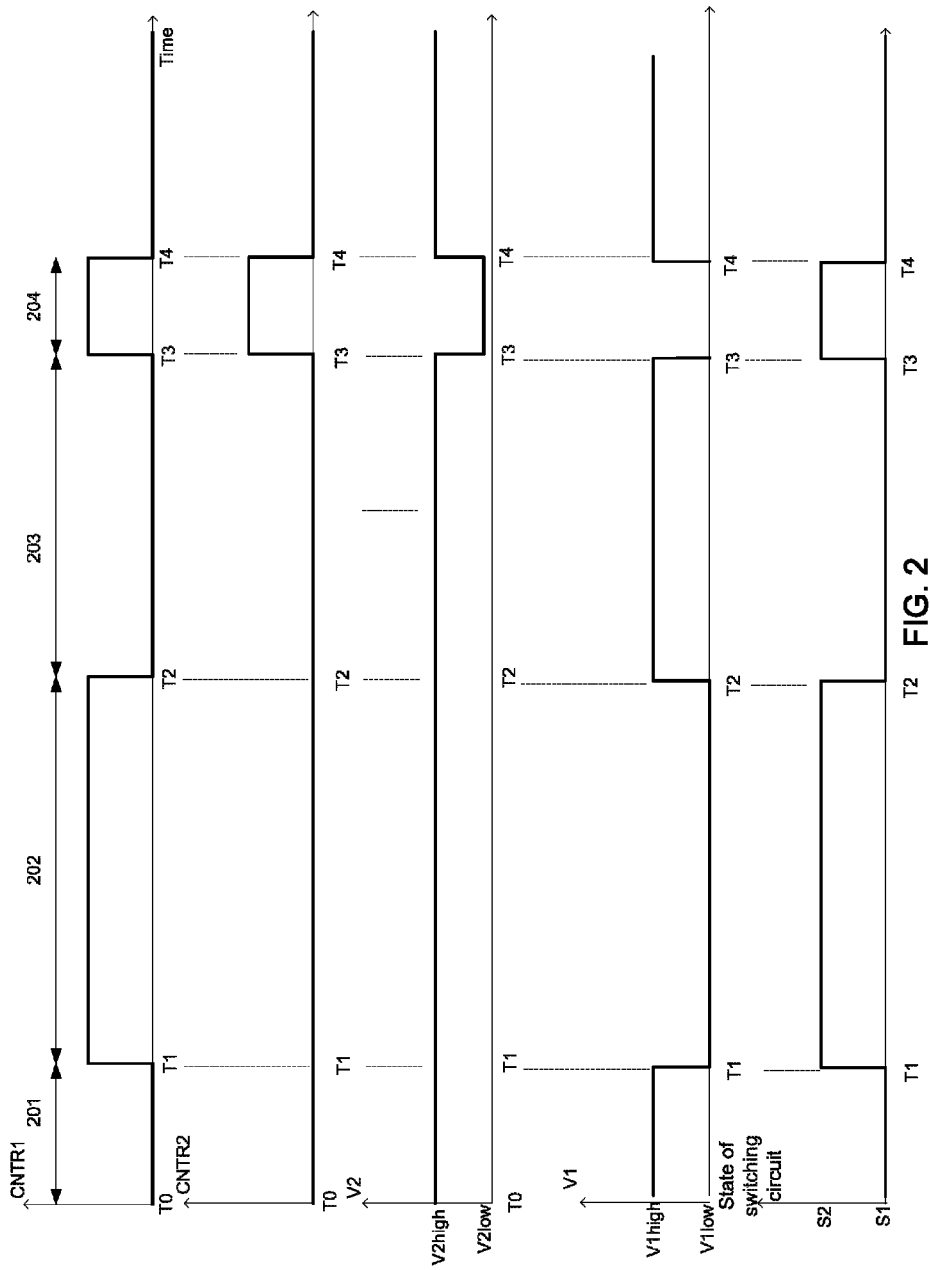
FIG. 2 schematically shows a timing diagram of control signals and supply voltages suitable to operate the example of FIG. 1.

FIG. 1 schematically shows an example of an embodiment of a electronic circuit 10. The electronic circuit 10 includes a SRPG circuit 11, a second circuit 12, a first power grid 21, a second power grid 22, a third power grid 23, a switching circuit 30, a first power source 41, a second power source 42 and a controller 50.

The SRPG circuit 11 has a functional mode and a state retention mode. The SRPG circuit 11 is in the functional mode during functional periods and in the state retention mode during state retention periods. The SRPG circuit 11 changes its operational modes under the control of the controller 50. The SRPG circuit 11 is arranged to process information (either alone or in combination with other circuits) or to store information when in the functional mode and the SRPG circuit 11 holds state information when in the state retention mode. State information is information that is indicative of a state of the SRPG circuit 11 or of another circuit at an end of the functional mode. The second circuit 12 may consume power, and more generally: operate, independent of the operational mode of the SRPG circuit 11. The second circuit 12 may be any suitable circuit, for example a peripheral such as a hardware accelerator, an interface, a direct memory access controller, a communication port, a receiver, a transmitter and the like.

The electronic circuit 10 may include an integrated circuit 60. The integrated circuit 60 may include the SRPG circuit 11, the second circuit 12, the first power grid 21, the second power grid 22 and the third power grid 23. The first and second power sources 41 and 42 and the controller 50 may be connected to the integrated circuit 60. In the example of FIG. 1, for instance, The integrated circuit 60 is connected to separate power sources 41 and 42 via different input ports 211,212 respectively.

As shown, the SRPG circuit 11 is connected to the first power grid 21 and the second power grid 22 through the third power grid 23 and the switching circuit 30. The switching circuit 30 selectively connected the first power grid 21 or the second power grid 22 to the third power grid 23. When in the state retention mode the SRPG circuit 11 receives power from the second power source 42, through the second power grid 22, the switching circuit 30 and the third power grid 23. On the other hand, the first power grid 21 does not provide any power to the SRPG circuit 11 in the state retention mode. When in the functional mode the SRPG circuit 11 receives power from the first power source 41, via the first power grid 21, the switching circuit 30 and the third power grid 23.

By selectively connecting the power grids 21, 22, 23 to each other the design of the integrated circuit can be simplified, as a designer may locate one or more switches of the switching circuit without being limited by constraints imposed by the exact location of power supply pins or by the location of the SRPG circuit. These constraints are especially hard to comply to in flip-chip package integrated circuits in which power supply pins are positioned above (or below) the silicone substrate on which the SRPG circuit is formed. For instance, the first, second and third power grids 21, 22, 23 can be spread over large portions of the integrated circuit 60, while the switching circuit 30 may be placed in any location out of a large number of available locations.

Furthermore, the power consumed by the SRPG circuit 11 when in a state retention mode is low, so that the number of switches between the second and third power grid 22 and 23 may be relatively low. Thus further simplifying the placement of the switching circuit.

The power supplied from the third power grid 23 facilitates storing of state information while the power supplied from the first power grid 21 facilitates a functional mode of the SRPG circuit 11. The third power grid 23 may also provide power to the SRPG circuit 11 when in the functional mode.

The SRPG circuit 11 may have a dedicated portion, which is not used in the functional mode, that stores the state information. Alternatively, the SRPG circuit 11 may have a portion that is utilized both in the functional mode and in the state retention mode to store the state information. In the former case, the third power grid 23 can be connected to the dedicated portion only, while the first power grid 21 can be connected to other portions of the SRPG circuit 11 only.

As shown in FIG. 1, the first power grid 21 may be connected to the SRPG circuit 11 and to the first power source 41. The first power source 41 is arranged to supply power to the first power grid 21 when the SRPG circuit 11 is in the functional mode. The first power source 41 is arranged to avoid supplying power to the first power grid 21 when the SRPG circuit 11 is in the state retention mode. The first power source 41 may be controlled by controller 50.

The second power grid 22 may be connected to the second circuit 12 and to the second power source 42. The second power source 42 is arranged to supply power to the second power grid 22 regardless of the operational mode of the SRPG circuit 11. The second power source 42 may supply power to the second power grid 22 when the SRPG circuit 11 is in the functional mode as well as when the SRPG circuit 11 is in the state retention mode.

The third power grid 23 may receive the same (or substantially the same) level of supply voltage regardless of the power grid (first or second) to which it is connected. Alternatively, during state retention periods the third power grid 23 may receive a lower supply voltage (or a higher supply voltage) in comparison to the supply voltage it receives during functional periods.

When the electronic circuit 10 is shut down both power sources 41 and 42 may stop the provision of power.

The switching circuit 30 may be connected to the first, second and third power grids 21, 22 and 23. The switching circuit 30 connects the third power grid 23 to the second power grid 22, when the SRPG circuit 11 is in a state retention mode. Thus in the state retention mode power is provided to the third power grid 23 by the second power grid 22. The switching circuit 30 connects, when the SRPG circuit 11 is in the functional mode, the third power grid 23 to the first power grid 21. Thus in the functional mode power is provided to the third power grid 23 by the first power grid 21.

The switching circuit 30 may be implemented in any manner suitable for the specific implementation, In the shown example, the switching circuit 30 includes a control input 304 for receiving a first control signal CNTR1 101 that is indicative of a desired functional mode of the SPRG circuit—the control signal CNTR1 101 indicates whether the SRPG circuit 11 should operate in a state retention mode or in a functional mode. A first input 301 of the switching circuit 30 is connected to the first power grid 21. A second input 302 of the switching circuit 30 is connected to the second power grid 22. An output 303 of the switching circuit 30 is connected to the third power grid 23. The first and second inputs 301 and 302 are connected to output 303 via a switch 31 that is controlled by the first control signal CNTR1 101 that is provided to the control input 304, and which selects between the first and the second input based on the first control signal.

It is noted that although FIG. 1 illustrates a single switch 31, with a single set of inputs 301 and 302, a single output 303, and a single control input 304, the switching circuit 30 may include multiple sets of input ports, output ports, switches and control inputs that are located in different locations thus providing connections between the different power grids 21, 22 and 23 in multiple locations.

The controller 50 may be implemented in any manner suitable for the specific implementation, The controller 50 for instance may be a part of a power management integrated circuit PMIC (not shown) that applies any standard SRPG scheme or any other power reduction scheme suitable to reduce the power consumption of the integrated circuit 60.

The controller 50 may be arranged to: (i) determine when the SRPG circuit 11 should operate in the state retention mode and when the SRPG circuit 11 should operate in the functional mode, or receive from another circuit an indication that is indicative of a desired operational mode of the SRPG circuit 11, and (ii) send the first control signal CNTR1 101 indicative of the determination to the switching circuit 30, and the SRPG circuit 11. In this example, the first control signal CNTR1 is further outputted to the first power source 41.

The determination to operate the SRPG circuit 11 in functional mode or state retention mode may be made in any manner suitable for the specific implementation, The controller 50 may, for example, determine not to instruct the SRPG circuit 11 to enter the state retention mode if the controller 50 estimates that the length of the state retention period is too short and, additionally or alternatively, if the power saved from entering the state retention mode does not justify entering the state retention mode.

The controller 50 may for example estimate a length of a state retention period using an estimation scheme, as is generally known in the art and for sake of conciseness not described in further detail. The estimation may for example be based on a heuristic prediction model, a stochastic prediction model or a combination thereof. The prediction may, for example, be based on a repetitive nature of tasks executed by the integrated circuits such as the execution of loops.

In addition to determining and controlling the desired mode of the SRPG circuit 11, the controller 50 may control the electronic circuit 10 in other aspects. The controller 50 may, for example, control the voltage supply by the second power source 42 and e.g. instruct the second power source 42 to reduce the level of voltage supplied to the second power grid 22 if predetermined requirements are met. The controller 50 may for example output a second control signal CNTR2 102 to the second power source 42 in order to control the level of the voltage supplied to the second power grid 22. For instance, the instruction may be generated if, for example, the controller 50 determines that the length of the state retention period merits entering the power retention mode but it not long enough to have a negative effect on the functionality of the second circuit 12. The level of voltage supplied to the second power grid 22 may e.g changed when the SRPG circuit 11 enters the state retention mode, for example reduced to a reduced level still high enough to allow the SRPG circuit 11 to store the state information.

Also, the controller 50 may send a second control signal CNTR2 102 to the second power source 42 that in turn will change (for example—reduce) the level of the voltage V2 provided to the second power grid 22 (and eventually to the SRPG circuit 11) when the SRPG circuit 11 enters the power retention mode. The controller 50 may alter the value of the second control signal CNTR2 102 and this may cause the second power source 42 to increase the level of the voltage (V2) provided to the second power grid 22 when the SRPG circuit 11 exits the state retention mode. The change in the level of V2 may be triggered when the duration in the state retention mode is expected to be shorter than a predefined time threshold, when a functionality of the second circuit 12 is not expected to be hampered due to the voltage level reduction, and the like.

The change in the level of V2 may be triggered whenever the SRPG circuit 11 enters or leaves the state retention mode. In this latter case CNTR1 101 and CNTR2 102 may be the same signal or be of the same value.

Although in FIG. 1 only a single SRPG circuit is shown, it will be apparent that the electronic circuit 10 may include multiple SRPG circuits. For example, the electronic circuit may comprise multiple SPRG circuits which form a processor or are included in a processor. A processor may include multiple SRPG flip-flops that are connected to each other via logic circuits that are not powered during state retention periods.

The SRPG circuit 11, when in a functional mode, has an average power consumption that may exceed an average power consumption of the second circuit 21.

Accordingly, the first power grid 21 may have an impedance that is lower than an impedance of the second power grid 22. The reduced impedance assists in a reduction of first power grid 21 voltage drops (IR drops).

As shown in FIG. 1, the first power grid 21 may be connected to the first power source 41 via multiple (N1) inputs 211. These multiple inputs 211 may be located in multiple locations and assist in reducing the IR drops from each input 211 to the SRPG circuit 11. The integrated circuit 60 may include multiple pins (not shown) that can be connected to the first power source 41 for receiving power from the first power source 41. These pins (not shown) are connected to the multiple inputs 211 of the first power grid 21.

The power consumption of the SRPG circuit 11 is relatively low during the state retention periods in comparison to the power consumed by the SRPG circuit 11 during a functional period. Accordingly—the IR drop over the third power grid 23 during state retention periods is smaller than the IR drop that might have been developed if the SRPG circuit 11 would receive power from the second and third power grids in the functional mode. Thus, the third power grid 23 may be connected to the second power grid 22 by relatively few inputs.

For instance, the third power grid 23 may be connected to the switching circuit 30 via N3 inputs, wherein N1 and N3 are integers and N1 is bigger than N3. A ratio between N1 and N3 may be substantially equal to a ratio between a current consumed by the SRPG circuit 11 during a state retention period and a current consumed by the SRPG circuit 11 during a functional period. For example, N1 may be at least ten times bigger than N3. Yet for another example, the third power grid 23 may be connected to the switching circuit 30 via a single input—as illustrated in FIG. 1.

V2V2V2V2FIG. 2 schematically illustrates an timing diagram of control signals and supply voltages suitable to operate the example of FIG. 1, although it will be apparent that another timing may also be used for the example of FIG. 1.

During a first functional period 201 (during which the third power grid 23 is connected to the first power grid 21) between points of time T0 and T1 while control signals CNTR1 101 and CNTR2 are low. The level of a first supply voltage V1 provided by the first power source 41 is high (V1 high), and the level of a second supply voltage V2 supplied by the second power source 42 is high (V2high).

The first functional period 201 is followed by a first state retention period 202 between points of time T1 and T2. The transition, at time T1, from the first functional period 201 into the first state retention period 202 is triggered by a change in the first control signal CNTR1 101—from a low level to a high level. In response to the change in the first control signal, the SRPG circuit 11 stores state information, and switching circuit 30 connects the second power grid 22 to the third power grid 23. Furthermore the change in the first control signal causes the first power source 41 to stop providing power.

In this example, the first state retention period 202 is long enough to hamper the functionality of the second circuit 12 if the second supply voltage V2 is lowered. Thus, the controller 50 does not change the value of CNTR2 102 and the second supply voltage V2 that is supplied by the second power source 42 remains high (V2high).

The first state retention period 202 is followed by a second functional period 203 between points of time T2 and T3. The transition between the first state retention period 202 and the second functional period 203 is triggered by a change in the first control signal CNTR1 101—from a high level to a low level. In response to the change, the SRPG circuit 11 enters a functional mode, the switching circuit 30 connects the third power grid 23 to the first power grid 21, so that the power supply by the first power source is provided to the third power grid.

The second functional period 203 is followed by a second state retention period 204 between points of time T3 and T4. The transition between the second functional period 203 and the second state retention period 204 is triggered by a change in the first control signal CNTR1 101—from a low level to a high level. This change causes the SRPG circuit 11 to store state information, causes the switching circuit 30 to connect the second power grid 22 to the third power grid 23, and may cause the first power source 41 to stop providing power to the SRPG circuit.

The second state retention period 204 may be short enough, and is not expected, to hamper the functionality of the second circuit 12 even if the second supply voltage V2 is lowered so that the controller 50 changes the value of CNTR2 102 from low to high and this causes the second supply source 42 to reduce the level of the second supply voltage V2 to a low value (V2low).

The controller 50 may alter the value of the second supply voltage V2 regardless of the length of the state retention period or, alternatively controller 50 may reduce the level of the second supply voltage V2 depending on the expected duration, for example when the state retention period is expected to be long enough in order to obtain sufficient power savings. The reduction of the second supply voltage V2 may be conditioned by the lack of activity of second circuit 12.

Figure 3:
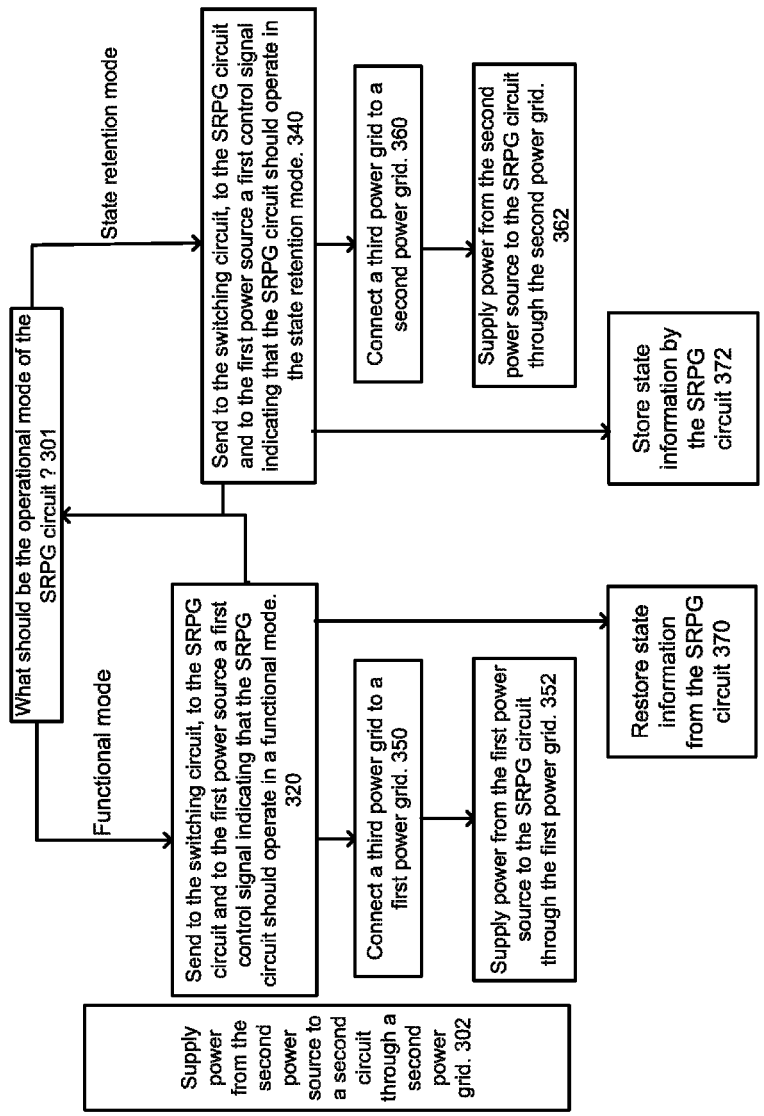
FIG. 3 schematically shows a flow chart of a first example of a method for state retention power gating.

FIG. 3 schematically shows a flow chart of a first example of a method 300.

Method 300 may include stages 310, 320, 330 and 340.

Stage 310 includes determining, by a controller, to activate a SRPG circuit in a functional mode or receiving an indication, by the controller, that indicates that the SRPG circuit should enter the functional mode.

Stage 310 is followed by stage 320 of sending to the switching circuit, to the SRPG circuit and to the first power source a first control signal indicating that the SRPG circuit should operate in a functional mode; connecting, by the switching circuit, a third power grid to a first power grid; supplying power from the first power source to the SRPG circuit via the first power grid, the switching circuit and the third power grid; and supplying power from a second power source to a second circuit via a second power grid.

Stage 320 is followed by stage 330 of determining, by the controller, to activate the SRPG circuit in a state retention mode or receiving an indication, by the controller, that indicates that the SRPG circuit should enter the state retention mode.

Stage 330 is followed by stage 340 of sending to the switching circuit, to the SRPG circuit and to the first power source a first control signal indicating that the SRPG circuit should operate in a state retention mode; connecting, by the switching circuit, the third power grid to the second power grid; supplying power from the second power source to the SRPG circuit via the second power grid, the switching circuit and the third power grid; supplying power from the second power source to the second circuit via the second power grid; and storing, by the SRPG circuit, state information.

The first control signal may trigger the storage of state information in the SRPG circuit although the first control signal may be preceded by another control signal (not shown) that triggers the storage of the state information. If the former occurs, then the storage of the state information should be completed before the SRPG enters the state retention mode.

Stage 340 may be followed by stage 310 as illustrated by the dashed line that connected these two stages.

The level of a second supply voltage supplied to the second power grid may be altered based on the operational mode of the SRPG circuit. The level of the second supply voltage may be reduced (or increased) when the SRPG circuit 11 enters a state retention mode. A reduction may be triggered whenever the SRPG circuit enters the state retention mode or when the duration of the state retention period is shorter than a predefined threshold that is set to prevent a non-tolerable decrement in the functionality of the second circuit.

Figure 4:
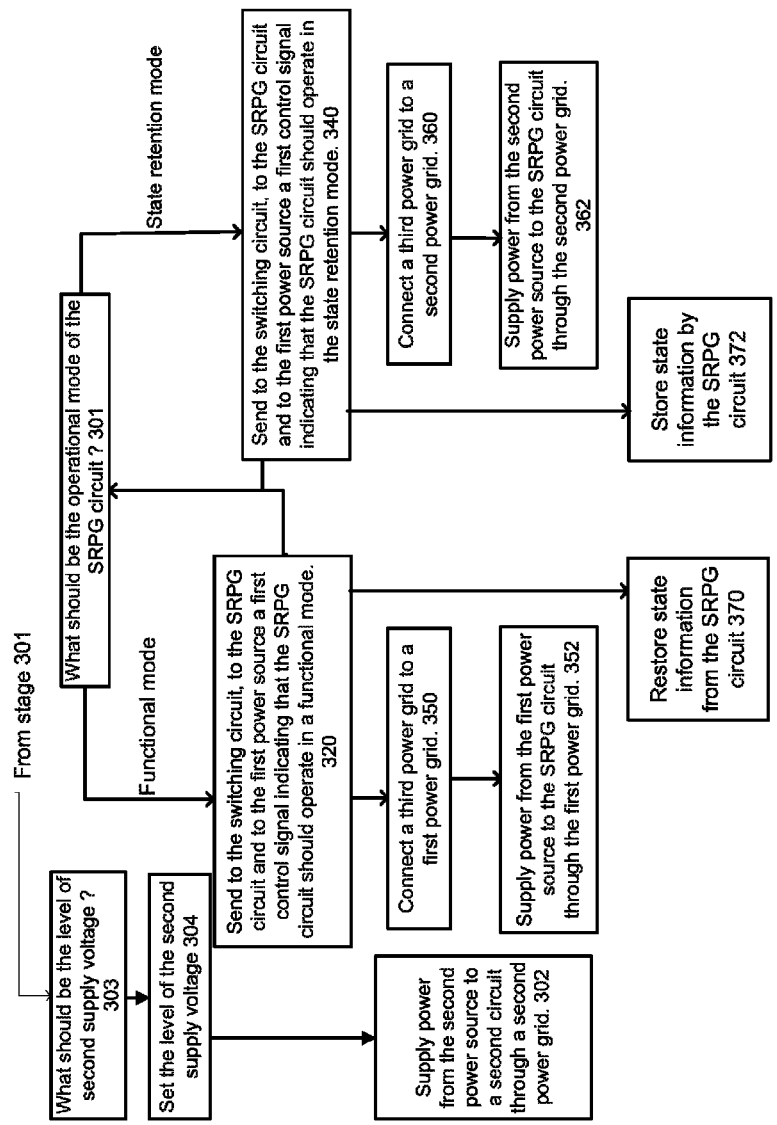
FIG. 4 schematically shows a flow chart of a second example of a method for state retention power gating.

FIG. 4 schematically shows a flow chart of a second example of a method 400.

Method 400 may include stages 410-440.

Stage 410 includes determining, by a controller, to activate a SRPG circuit in a functional mode or receiving an indication, by the controller, that indicates that the SRPG circuit should enter the functional mode. Stage 410 may also include determining to set a second supply voltage that is supplied by the second power source to a first level.

Stage 410 is followed by stage 420 of sending to the switching circuit, to the SRPG circuit and to the first power source, a first control signal indicating that the SRPG circuit should operate in a functional mode; connecting, by the switching circuit, a third power grid to a first power grid; supplying power from the first power source to the SRPG circuit via the first power grid, the switching circuit and the third power grid; supplying power from a second power source to a second circuit via a second power grid; and setting the level of the second supply voltage to the first level.

Stage 420 is followed by stage 430 of determining, by the controller, to activate the SRPG circuit in a state retention mode or receiving an indication, by the controller, that indicates that the SRPG circuit should enter the state retention mode. Stage 430 also includes determining by the controller whether to set the second supply voltage to a second level that is lower than the first level. If the second supply voltage should be set to the first level, stage 430 is followed by stage 440. If the second supply voltage should be set to the second level, stage 430 is followed by stage 435. Stage 435 includes setting the second supply voltage to the second level. Stage 435 may include sending a second control signal to the second power source. Stage 435 is followed by stage 440.

Stage 440 includes sending to the switching circuit, to the SRPG circuit and to the first power source, a first control signal indicating that the SRPG circuit should operate in a state retention mode; connecting, by the switching circuit, the third power grid to the second power grid; supplying power from the second power source to the SRPG circuit via the second power grid, the switching circuit and the third power grid; supplying power from the second power source to the second circuit via the second power grid; and storing, by the SRPG circuit, state information.

The first control signal may trigger the storage of state information in the SRPG circuit although the first control signal may be preceded by another control signal (not shown) that triggers the storage of the state information. If the former occurs, then the storage of the state information should be completed before the SRPG enters the state retention mode.

Stage 440 may be followed by stage 410 as illustrated by the dashed line that connected these two stages.

Method 300 and 400 may for example be executed by the electronic circuit 10 of FIG. 1.

In the foregoing specification, the invention has been described with reference to specific examples of embodiments of the invention. It will, however, be evident that various modifications and changes may be made therein without departing from the broader spirit and scope of the invention as set forth in the appended claims. For example, an SRPG circuit may be an SRPG flipflop, a memory unit and the like. Yet for another example, a controller that determines in which operational mode to operate the SRPG circuit may belong to the same integrated circuit as the SRPG circuit or may belong to another integrated circuit.

Furthermore, each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A electronic circuit, comprising:
    a state retention power gating (SRPG) circuit having a functional mode and a state retention mode, said SRPG circuit storing state information when in the state retention mode;
    a first power grid coupling to the SRPG circuit for providing power from a first power source to the SRPG circuit when the SRPG circuit is in a functional mode; wherein the first power source is arranged to avoid supplying power to the first power grid when the SRPG circuit is in the state retention mode;
    a second circuit;
    a second power grid coupling to the second circuit for providing power from a second power source to the second circuit independent from the mode of the SRPG circuit;
    a switching circuit;
    a third power grid coupling the SRPG circuit to the switching circuit for providing power received from said switching circuit to the SRPG circuit; and
    wherein the switching circuit is arranged to couple the third power grid to the first power grid when the SRPG is in the functional mode and to couple the third power grid to the second power grid when the SRPG is in the state retention mode;
    wherein the electronic circuit further comprising a controller connected to the switching circuit, the SRPG circuit and the first power source, which controller is arranged to generate a control signal that is indicative of a desired operational mode of the SRPG circuit, the desired operational mode being selected from the state retention mode and the functional mode, and to output the control signal to the switching circuit, the SRPG circuit and the first power source.

2. The electronic circuit according to claim 1, wherein the SRPG circuit is a SRPG flip-flop.

3. The electronic circuit according to claim 1, wherein the second circuit is a peripheral.

4. The electronic circuit according to claim 1, comprising an integrated circuit; the integrated circuit comprising the SRPG circuit, the second circuit, the first power grid, the second power grid and the third power grid.

5. The electronic circuit according to claim 1, wherein the SRPG circuit, when operating in the functional mode, has an average power consumption that exceeds an average power consumption of the second circuit.

6. The electronic circuit according to claim 1, wherein the first power grid is coupled to the first power source via N1 inputs, wherein the third power grid is coupled to the switching circuit via N3 inputs, wherein N1 and N3 are integers and N1 is bigger than N3.

7. The electronic circuit according to claim 6, wherein N1 is at least ten times bigger than N3.

8. The electronic circuit according to claim 1, wherein the third power grid is coupled to the switching circuit via a single input.

9. The electronic circuit according to claim 1, wherein the second power source is arranged to alter a level of a second supply voltage supplied to the second power grid based on the operational mode of the SRPG circuit.

10. The electronic circuit according to claim 1, wherein the controller is coupled to the second power source, for instructing the second power source to alter a level of a supply voltage provided to the second power grid if an expected duration of the state retention mode is lower than a threshold duration.

11. The electronic circuit according to claim 1, wherein the SRPG circuit is a memory unit configured to store state information indicative of a state of a circuit that differs from the memory unit, before the SRPG circuit enters the state retention mode.

12. A method for state retention power gating, the method comprising:
    supplying power from a second power source to a second circuit via a second power grid independent from a mode of a state retention power gating (SRPG) circuit;
    sending to a switching circuit and to the SRPG circuit a control signal indicating whether the SRPG circuit should operate in a functional mode or in a state retention mode;
    when said control signal indicates that the SRPG circuit should operate in the functional mode:
    coupling in response to receiving the control signal, by the switching circuit, a third power grid to a first power grid;
    supplying power from the first power source to the SRPG circuit via a first path comprising the first power grid, the switching circuit and the third power grid; and
    operating the SRPG circuit in the functional mode;when said control signal indicates that the SRPG circuit should operate in the state retention mode:
    coupling in response to receiving the control signal, by the switching circuit, the third power grid to the second power grid and decoupling the third power grid from the first power grid;
    supplying power from the second power source to the SRPG circuit via a second path comprising the second power grid, the switching circuit and the third power grid; and
    storing by the SRPG circuit, state information.

13. The method according to claim 12, wherein the SRPG circuit is a SRPG flip-flop.

14. The method according to claim 12, wherein the second circuit is a peripheral.

15. The method according to claim 12, wherein the SRPG circuit, when operating in a functional mode, has an average power consumption that exceeds an average power consumption of the second circuit.

16. The method according to claim 12, wherein the first power grid is coupled to the first power source via N1 inputs, wherein the third power grid is coupled to the switching circuit via N3 inputs, wherein N1 and N3 are integers and wherein N1 is bigger than N3.

17. The method according to claim 16, wherein N1 is at least ten times bigger than N3.

18. The method according to claim 16, wherein the third power grid is coupled to the switching circuit via a single input.

19. The method according to claim 12, comprising altering a level of a second supply voltage supplied to the second power grid based on the operational mode of the SRPG circuit.

20. The method according to claim 12, comprising altering a level of a second supply voltage provided to the second power grid if an expected duration of the state retention mode is lower than a threshold.

* * * * *